United States Patent
Azuma et al.

[11] Patent Number: 6,160,461
[45] Date of Patent: *Dec. 12, 2000

[54] MULTILAYER NOISE FILTER INCLUDING INTEGRAL DAMPING RESISTOR

[75] Inventors: Takahiro Azuma; Yasuhiro Nakata, both of Fukui, Japan

[73] Assignee: Murata Manufacturing Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 09/067,441

[22] Filed: Apr. 28, 1998

[30] Foreign Application Priority Data

May 19, 1997 [JP] Japan ................................. 9-128135

[51] Int. Cl.[7] ....................................................... H03H 7/06
[52] U.S. Cl. ............................ 333/172; 333/184; 333/185
[58] Field of Search ................................... 333/172, 184, 333/185; 361/270, 275.3, 321.2, 321.3

[56] References Cited

U.S. PATENT DOCUMENTS

| | | | |
|---|---|---|---|
| 3,701,958 | 10/1972 | Jaag | 333/185 |
| 5,420,553 | 5/1995 | Sakamoto et al. | 333/172 |
| 5,495,387 | 2/1996 | Mandai et al. | 333/172 X |

FOREIGN PATENT DOCUMENTS

| | | | |
|---|---|---|---|
| 1-213017 | 8/1989 | Japan | 333/172 |
| 5-275959 | 10/1993 | Japan | 333/172 |

*Primary Examiner*—Justin P. Bettendorf
*Attorney, Agent, or Firm*—Keating & Bennett LL

[57] ABSTRACT

A multilayer noise filter includes a damping resistor which is arranged to control the distortion of the waveform of an output signal and eliminate a space required for installation of the damping resistor on a substrate upon which the filter is mounted. The axial direction of coils incorporated in inductor assemblies is substantially perpendicular to external input and output electrodes. One end of one coil is electrically connected to the external input electrode and one end of another coil is electrically connected to the external output electrode. The other ends of the coils are electrically connected to a resistor at different locations, respectively. The resistor connecting the external input and output electrodes is disposed on the top surface of a multilayer unit such that the resistor is substantially parallel to the stacking direction of the multilayer unit and the axial direction of the coils. In a capacitor assembly, a pair of capacitor conductors are arranged to face each other.

16 Claims, 3 Drawing Sheets

MULTILAYER NOISE FILTER INCLUDING INTEGRAL DAMPING RESISTOR

BACKGROUND OF THE INVENTION

1. Field of the Invention

The present invention relates to a multilayer noise filter and, more particularly, to a multilayer noise filter which is constructed to eliminate and remove noises which are produced by high-frequency electronic equipment.

2. Description of Related Art

An example of a conventional multilayer noise filter is shown in FIG. 5. A conventional multilayer noise filter 41 includes inductor assemblies 42 and 43 which are constructed by stacking a plurality of coiled conductors and insulator layers, and a capacitor assembly 44 located between the inductor assemblies 42, 43. FIG. 5 schematically shows coils 51 and 52, which have been constructed by electrically connecting a plurality of coiled conductors, in the inductor assemblies 42 and 43, respectively. The axial direction of the coils 51 and 52, and the stacking direction of the inductor assemblies 42 and 43 and the capacitor assembly 44 are perpendicular relative to the external input and output electrodes 45 and 46, respectively, to reduce stray capacitance to thereby improve the insertion loss characteristic within a high-frequency region. One end of a capacitor conductor 55 of the capacitor assembly 44 is connected to a repeater electrode 48 and one end of a capacitor conductor 56 is connected to an external ground electrode 47. The coils 51 and 52 are electrically connected to each other via the repeater electrode 48.

FIG. 6 is an electric equivalent circuit diagram of the noise filter 41.

The conventional noise filter 41 experiences a problem in that the signal waveforms output from the noise filter 41 incur overshoots or other types of distortion due to impedance mismatching or resonance relative to a printed circuit board or other substrate on which the noise filter 41 is mounted. To control such distortions, it has been necessary to provide a damping resistor, which is separate from the filter, near the filter and electrically connect the damping resistor to the noise filter 41. The addition of the damping resistor requires extra mounting space on the printed circuit board or substrate upon which the noise filter is mounted and also requires extra assembly steps to mount and electrically connect the damping resistor thereby increasing the time, cost and difficulty of filter assembly process.

SUMMARY OF THE INVENTION

The preferred embodiments of the present invention overcome the problems described above by providing a multilayer noise filter including an integral damping resistor provided therein to control the distortion of an output signal waveform while eliminating the requirement of a mounting space on a printed circuit board or substrate upon which the filter is mounted.

According to a preferred embodiment of the present invention, a multilayer noise filter includes a multilayer unit in which a plurality of coil conductors and insulating layers are stacked and a coil defined by connecting the coil conductors in series is incorporated in the multilayer unit, an external input electrode and an external output electrode which are connected to the coil and which are disposed on a pair of opposed surfaces of the multilayer unit such that the external input and output electrodes are substantially perpendicular to a direction of stacking of the multilayer unit and an axial direction of the coil; and a resistor connecting the external input and output electrodes to each other, the resistor being disposed on at least one surface of the multilayer unit other than the surfaces on which the input and output electrodes are disposed and which resistor is arranged to be substantially parallel to the stacking direction of the multilayer unit and the axial direction of the coil.

The above configuration and arrangement makes it possible to incorporate the damping resistor in the noise filter of preferred embodiments of the present invention without increasing the size of the multilayer noise filter. Therefore, there is no need to provide excess space on a printed circuit board or mounting substrate for locating the damping resistor in the filter of the preferred embodiments of the present invention, as was required with conventional filters.

In the multilayer noise filter in accordance with preferred embodiments of the present invention, an external ground electrode is provided on at least one surface of the multilayer unit other than a pair of surfaces on which external input and output electrodes are disposed and the surface on which the resistor is disposed. The multilayer unit preferably further includes a capacitor which is defined by stacking at least a pair of capacitor conductors and an insulating layer, wherein one of the capacitor conductors is electrically connected to the resistor, while the other capacitor conductor is electrically connected to the external ground electrode. Thus, an LC noise filter featuring outstanding noise removing performance can be easily achieved.

These and other elements, features and advantages of preferred embodiments of the present invention will be apparent from the following detailed description of preferred embodiments of the present invention, as illustrated in the accompanying drawings, wherein like reference numerals indicate like elements to avoid repetition.

DETAILED DESCRIPTION OF PREFERRED EMBODIMENTS

A preferred embodiment of the multilayer noise filter in accordance with the present invention will be described in conjunction with the accompanying drawings.

Figure 1:
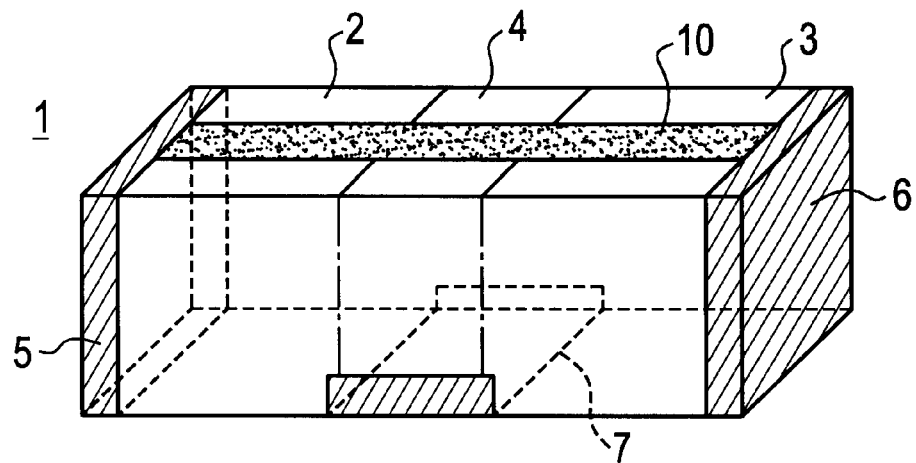
FIG. 1 is a perspective view showing a preferred embodiment of a multilayer noise filter in accordance with the present invention.

As shown in FIG. 1, a multilayer noise filter 1 is arranged and constructed such that a capacitor assembly 4 is located between inductor assemblies 2 and 3. An external input electrode 5 and an external output electrode 6 are disposed, respectively on the right and left opposite side surfaces of the filter 1. An external ground electrode 7 is disposed at the approximate central portion of the bottom surface of the filter 1. A resistor 10 is preferably located on the top surface of the filter 1.

Figure 2:
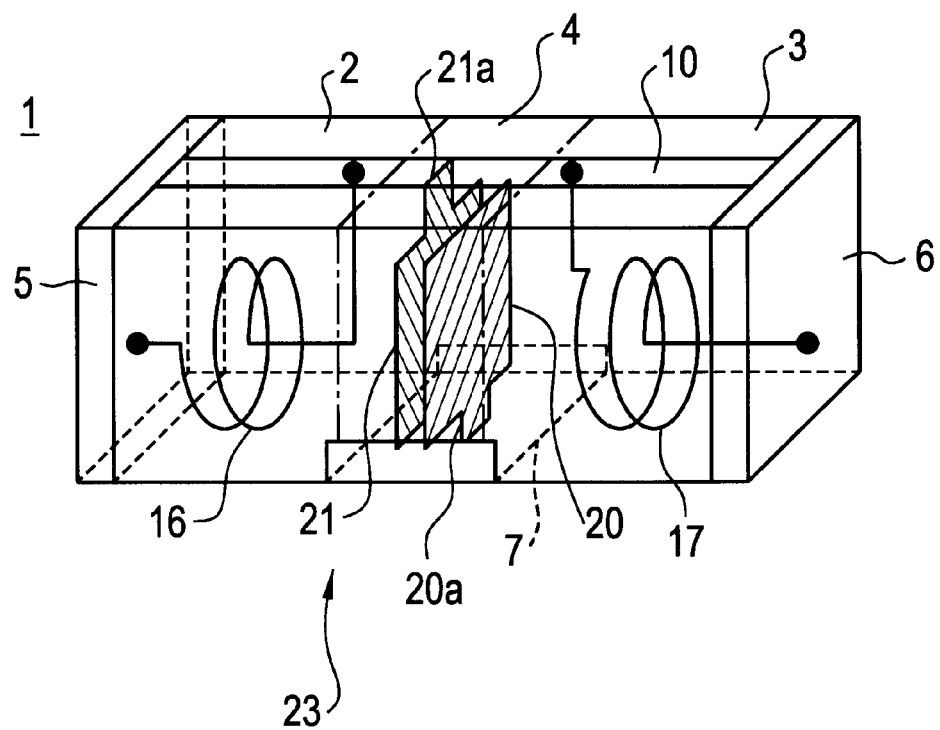
FIG. 2 is a perspective view showing the interior of the multilayer noise filter shown in FIG. 1.

As schematically shown in FIG. 2, the axial direction of coils 16 and 17 included in the inductor assemblies 2 and 3, respectively, is substantially perpendicular to the external input and output electrodes 5 and 6. One end of the coil 16 and one end of the coil 17 are electrically connected to the external input electrode 5 and the external output electrode 6, respectively. The other ends of the electrodes 5, 6 are electrically connected to the resistor 10 at different positions, respectively.

In a capacitor assembly 4 provided in the filter 1, a pair of capacitor conductors 20 and 21 are disposed to be arranged opposite to each other. An end 20a of the capacitor conductor 20 is electrically connected to the external ground electrode 7, while an end 21a of the capacitor conductor 21 is electrically connected to the resistor 10. The end 21a and the resistor 10 are connected at a position which is located between points where the coils 16 and 17 are connected to the resistor 10.

Figure 3:
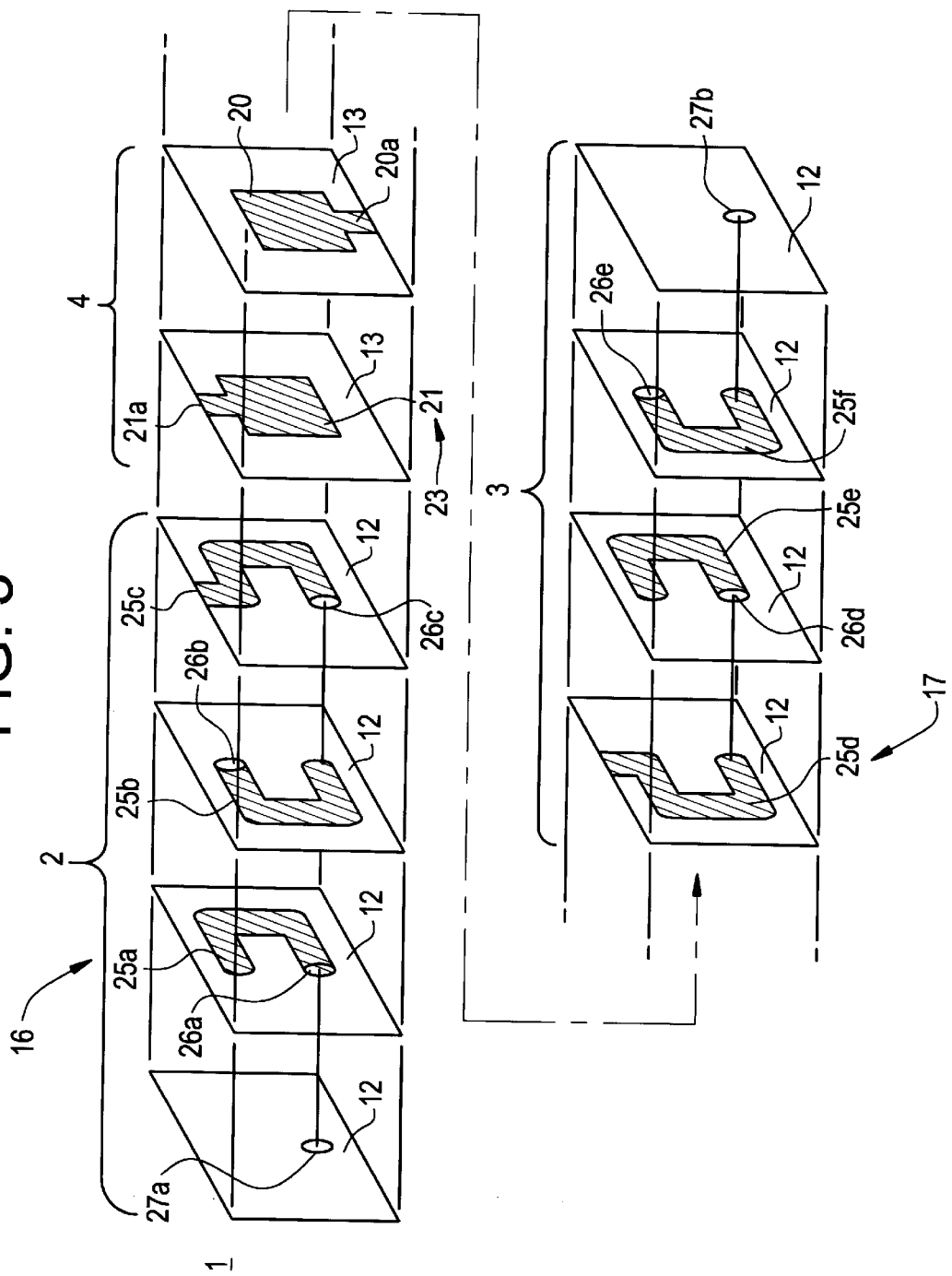
FIG. 3 is an assembly view of the multilayer noise filter shown in FIG. 1.

The structure and assembly process for the filter 1 according to preferred embodiments of the present invention will be described in more detail with reference to FIG. 3. The inductor assembly 2 is constructed preferably by providing a plurality of magnetic sheets 12 and arranging coil conductors 25a, 25b and 25c on some of the sheets 12 while at least one of the sheets 12 does not have a coil conductor thereon. Via holes 26a, 26b and 26c are formed in the sheets 12 having the coil conductors 25a, 25b, 25c, respectively, and the magnetic sheet 12 which does not have a coil conductor has a via hole 27a. The coil conductors 25a through 25c are electrically connected in series through the via holes 26b and 26c to define a solenoid coil 16. One end of the coil conductor 25c is exposed at the top central portion of the respective sheet 12 upon which it is located.

The magnetic sheets 12 are preferably made by kneading a magnetic powder such as ferrite together with a binder or the like, then by forming the mixture into sheets.

The inductor assembly 3 is preferably constructed by providing magnetic sheets 12 with coil conductors 25d, 25e and 25f, and via holes 26d and 26e, and the magnetic sheet 12 not having coil conductors is equipped with a via hole 27b. The coil conductors 25d through 25f are electrically connected in series through the via holes 26d and 26e to define a solenoid coil 17. One end of the coil conductor 25d is exposed at the top central portion of the sheet 12.

The capacitor assembly 4 is preferably constructed by providing a plurality of dielectric sheets 13 respectively provided with capacitor conductors 20 and 21. The end 20a of the capacitor conductor 20 is exposed at the bottom central portion of the sheet 13, while an end 21a of the capacitor conductor 21 is exposed at the top central portion of the sheet 13. The capacitor conductors 20 and 21 are opposed to each other to define a capacitor 23 which provides a large capacitance because of the multiple layer construction. The coil conductors 25a through 25f and the capacitor conductors 20 and 21 are preferably made of Ag, Pd, Ag—Pd, Cu, or other suitable materials. The coil conductors 25a through 25f are disposed on the surfaces of the sheets 12 and 13 preferably by using a well-known printing technique, sputtering technique, vacuum deposition, or other suitable technique. The dielectric sheets 13 are preferably produced by kneading dielectric powder together with a binder or the like, then forming the mixture into sheets.

The respective sheets 12 and 13 are stacked and sintered into one piece to form the structure in which the capacitor assembly 4 is located between the inductor assemblies 2 and 3 as shown in FIG. 1. Next, the external input electrode 5 and the external output electrode 6 are respectively disposed on the right and left side surfaces of the multilayer body, and the external ground electrode 7 is located on the bottom surface of the multilayer body. The electrodes 5 through 7 are preferably formed by sputtering, vacuum deposition, or coating and baking.

The external input electrode 5 is connected to one end of the coil 16 through the via hole 27a and the via hole 26a. More specifically, the electrode 5 is electrically connected to an end of the coil conductor 25a. The external output electrode 6 is connected to one end of the coil 17 through the via hole 27b. More specifically, the electrode 6 is electrically connected to an end of the coil conductor 25f. The external ground electrode 7 is electrically connected to the end 20a of the capacitor conductor 20.

The resistor 10 is arranged on the top surface of the multilayer body such that one end of the resistor 10 is electrically connected to the external input electrode 5 and the other end thereof is electrically connected to the external output electrode 6. The resistor 10 is preferably coated with an insulating protecting film.

Figure 4:
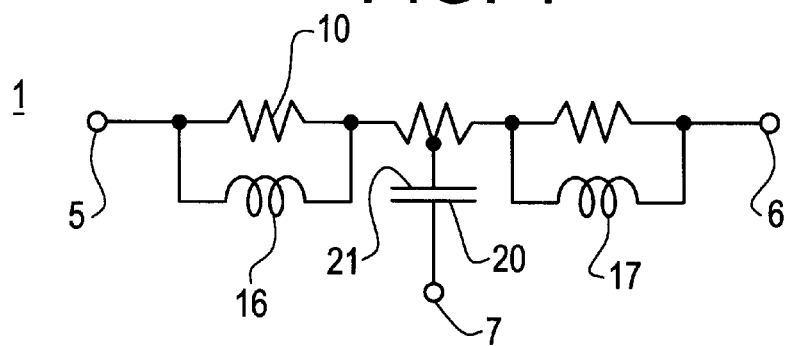
FIG. 4 is an electrical equivalent circuit diagram of the multilayer noise filter shown in FIG. 1.
Figure 5:
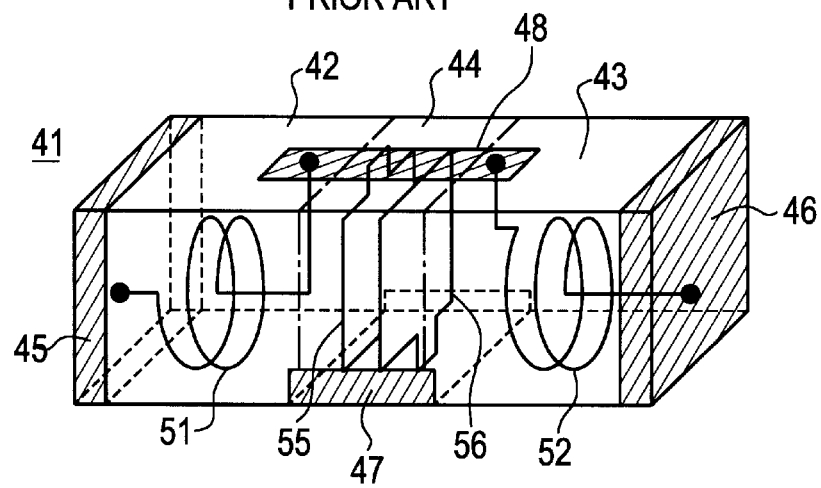
FIG. 5 is a perspective view showing the interior of a conventional multilayer noise filter.
Figure 6:
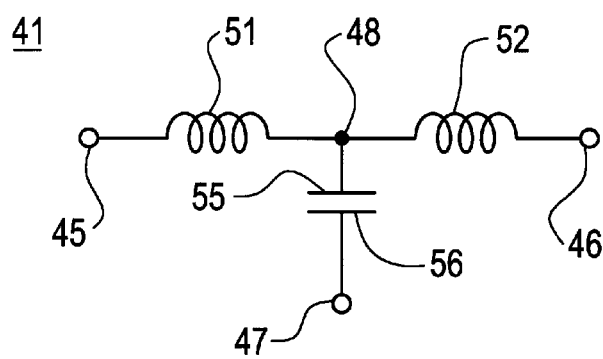
FIG. 6 is an electrical equivalent circuit diagram of the multilayer noise filter shown in FIG. 5.

FIG. 4 is an electrical equivalent circuit diagram of the filter 1.

In the LC noise filter 1 thus obtained in preferred embodiments of the present invention, the stacking direction of the sheets 12 and 13 is preferably substantially perpendicular to the external input electrode 5 and the external output electrode 6, and the axial direction of the coils 16 and 17 is preferably substantially perpendicular to the external input electrode 5 and the external output electrode 6. Hence, the stray capacitance produced and distributed between the coils 16 and 17 and the external electrodes 5 and 6 is extremely small, because the potential difference between the coil 16 and the external input electrode 5 and between the coil 17 and the external output electrode 6 is small, and the interval between the coil 16 and the external output electrode 6 and the interval between the coil 17 and the external input electrode 5 are large.

Furthermore, the resistor 10 connecting the external input and output electrodes 5 and 6 is preferably arranged to be substantially parallel to the stacking direction of the multilayer body and the axial direction of the coils 16 and 17. This allows the damping resistor to avoid causing a change in the outside dimension of the filter 1, thus making it possible to control the distortion of the waveforms of the signals generated by the external output electrode 6.

The multilayer noise filter in accordance with preferred embodiments of the present invention is not limited to the embodiments described above. It should be readily apparent that many different working modes can be formed on the basis of the preferred embodiments of this invention described above without departing from the spirit and scope of the invention.

In preferred embodiments described above, the description relates to the multilayer unit composed of the layers of the inductor assembly, the capacitor assembly, and another inductor assembly stacked in the order in which they are listed. The multilayer body may, alternatively be defined by a multilayer unit composed of an inductor assembly and a capacitor assembly; a multilayer unit composed of an inductor assembly, a capacitor assembly, an inductor assembly, a capacitor assembly, and an inductor assembly stacked in the order in which they are listed; a multilayer unit composed only of inductor assemblies; or other type of multilayer unit.

In preferred embodiments described above, the insulator sheets respectively provided with the conductors located thereon are preferably stacked and sintered to define a single unitary body. The present invention, however, is not limited thereto. The sheets may be sintered in advance.

Alternatively, the filter may be produced according to the following manufacturing method: the insulator layer is formed using a paste insulator material by printing or other suitable process, then a paste conductor material is preferably applied to a surface of the insulator layer. Further, the paste insulator material is applied on the conductor to define an insulator layer including the conductor. In the same manner, a filter having the multilayer structure can be obtained by repeating the process steps in order.

The equivalent circuit of the multilayer filter is not limited to the T type LCR filter. The multilayer filter according to preferred embodiments of the present invention may alternatively be a π type LCR filter, an L type LCR filter, an LR filter, or other type of filter.

Thus, according to preferred embodiments of the present invention, the resistor which connects the external input and output electrodes is disposed on at least one surface of the multilayer unit so that the resistor is substantially parallel to the stacking direction of the multilayer unit and the axial direction of the coils. As a result of this construction and arrangement, the damping resistor does not change an outside dimension of the multilayer noise filter, and thereby controls the distortion of the waveforms of output signals. This makes it possible to achieve a multilayer noise filter which obviates the need for providing a space for mounting a damping resistor which used to be conventionally required in a printed circuit board or the like.

Moreover, the external ground electrode is preferably provided on a surface of the multilayer unit, and the capacitor is incorporated in the multilayer unit so as to easily permit an LC noise filter featuring outstanding noise removing performance to be achieved.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A multilayer noise filter, comprising:
    a multilayer unit including a plurality of coil conductors and a plurality of insulating layers stacked on each other in a stacking direction, a coil which is defined by connecting said coil conductors in series and which extends in an axial direction, and a capacitor having at least a pair of capacitor conductors and an insulating layer stacked on each other in said stacking direction;
    at least one external input electrode and at least one external output electrode which are connected to said coil and which are disposed on a pair of opposed surfaces of said multilayer unit such that the external input and output electrodes are substantially perpendicular to the stacking direction of said multilayer unit and the axial direction of said coil;
    a resistor arranged to connect said external input and output electrodes, said resistor having substantially an elongated strip shape and disposed on substantially an entire length of at least one surface of said multilayer unit other than the pair of surfaces on which said input and output electrodes are disposed, said resistor being arranged to be substantially parallel to the stacking direction of said multilayer unit and the axial direction of said coil, and said resistor being electrically connected in parallel to each of said coil conductors.

2. A multilayer noise filter according to claim 1, wherein an external ground electrode is provided on at least one surface of said multilayer unit other than the pair of surfaces on which said external input and output electrodes are disposed and the surface on which said resistor is disposed.

3. A multilayer noise filter according to claim 2, further comprising a capacitor defined by stacking at least a pair of capacitor conductors and an insulating layer; wherein one of said capacitor conductors is electrically connected to said resistor and another of said capacitor conductors is electrically connected to said external ground electrode.

4. A multilayer noise filter according to claim 1, wherein said resistor is located at a substantially central portion along a length of said at least one surface of said multilayer unit other than the pair of surfaces on which said input and output electrodes are disposed.

5. A multilayer noise filter according to claim 1, wherein said resistor is electrically connected to at least one of said coil conductors.

6. A multilayer noise filter according to claim 1, wherein the coil conductors are electrically connected to the resistor along said at least one surface of said multilayer unit other than the pair of surfaces on which said input and output electrodes are disposed.

7. A multilayer noise filter according to claim 6, wherein a capacitor is located between points where the resistor is connected to each of said coil conductors.

8. A noise filter, comprising:
    a filter body including a plurality of coil conductors and a plurality of insulating layers and a coil which is defined by connecting said coil conductors, the insulating layers and coil conductors being stacked on each other in a stacking direction, and a capacitor having at least a pair of capacitor conductors and an insulating layer stacked on each other in said stacking direction, the filter body having a plurality of exterior surfaces extending in a lengthwise direction of the filter body and a plurality of exterior surfaces extending in a widthwise direction of the filter body;
    at least one external input electrode and at least one external output electrode which are connected to said coil and each of the input electrode and the output electrode is disposed on a respective one of the plurality of exterior surfaces extending in the widthwise direction of said filter body;
    a resistor having substantially an elongated strip shape arranged to electrically connect the external input and output electrodes and arranged to extend along substantially an entire length of one of the plurality of exterior surfaces extending in the lengthwise direction of the filter body and substantially parallel to the stacking direction, and said resistor arranged to be electrically connected in parallel to each of said coil conductors.

9. The noise filter according to claim 8, wherein said resistor is located at a substantially central portion along a length of at least one surface of said filter body.

10. The noise filter according to claim 8, wherein the coil conductors are electrically connected to the resistor along at least one surface of said filter body.

11. The noise filter of claim 10, wherein said resistor is disposed on at least one surface of the filter body other than the at least one surface upon which the external input and output electrodes are located.

12. The noise filter of claim 10, wherein said resistor is arranged to be electrically connected to at least one of said coil conductors.

13. The noise filter of claim 8, wherein said coil conductors and said insulating layers are stacked on each other in a stacking direction, and said coil extends in an axial direction, said resistor being arranged so as to be substantially parallel to the stacking direction and the axial direction.

14. The noise filter according to claim 8, wherein an external ground electrode is provided on at least one surface of said filter body other than said at least one surface on which said external input and output electrodes are disposed and a surface of said filter body on which said resistor is disposed.

15. The noise filter according to claim 14, further comprising a capacitor defined by stacking at least a pair of capacitor conductors and an insulating layer; wherein one of said capacitor conductors is electrically connected to said resistor and another of said capacitor conductors is electrically connected to said external ground electrode.

16. The noise filter according to claim 15, wherein the capacitor is located between points where the resistor is connected to each of said coil conductors.

* * * * *